(12) United States Patent
Ochiai

(10) Patent No.: US 12,216,925 B2
(45) Date of Patent: Feb. 4, 2025

(54) MEMORY CONTROL APPARATUS, METHOD FOR CONTROLLING MEMORY CONTROL APPARATUS, AND STORAGE MEDIUM

(71) Applicant: CANON KABUSHIKI KAISHA, Tokyo (JP)

(72) Inventor: Wataru Ochiai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 18/171,853

(22) Filed: Feb. 21, 2023

(65) Prior Publication Data
US 2023/0266894 A1 Aug. 24, 2023

(30) Foreign Application Priority Data
Feb. 24, 2022 (JP) ................................ 2022-026623

(51) Int. Cl.
*G06F 3/00* (2006.01)
*G06F 3/06* (2006.01)
(52) U.S. Cl.
CPC .......... *G06F 3/0625* (2013.01); *G06F 3/0634* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 2007/0016734 A1* | 1/2007 | Asauchi | G11C 7/24 711/E12.1 |
| 2022/0057937 A1* | 2/2022 | Askar | G11C 29/023 |
| 2024/0176840 A1* | 5/2024 | Nagpal | G06F 16/958 |

FOREIGN PATENT DOCUMENTS

JP 2021096739 A 6/2021

* cited by examiner

*Primary Examiner* — Midys Rojas
(74) *Attorney, Agent, or Firm* — Canon U.S.A., Inc. IP Division

(57) ABSTRACT

A memory control apparatus configured to access a memory that involves synchronization of a clock signal for command transfer and a clock signal for data transfer with each other, the clock signal for command transfer and the clock signal for data transfer being independent of each other, includes an output unit configured to change an output mode of the clock signal for data transfer based on a memory access state and to output the clock signal for data transfer to the memory based on the output mode.

13 Claims, 11 Drawing Sheets

MEMORY CONTROL APPARATUS, METHOD FOR CONTROLLING MEMORY CONTROL APPARATUS, AND STORAGE MEDIUM

BACKGROUND

Field

The present disclosure relates to a memory control apparatus, a method for controlling the memory control apparatus, and a storage medium.

Description of the Related Art

Dynamic random access memories (DRAMs) are commonly used as main storage apparatuses of computer systems. As functions and performance of computer systems are advancing, expected performance levels of DRAMs are rising, and maximizing their performance is demanded.

As discussed in Japanese Patent Application Laid-Open No. 2021-96739, recently-developed Low Power Double Data Rate 5 (LPDDR5) uses two clock signals into which a clock signal is divided: a clock signal for command transfer and a clock signal for data transfer. This calls for synchronization between a clock signal for data transfer and a clock signal for command transfer, and issuing a column address strobe (CAS) command prior to a read or write command. Further, there is a mode in which a clock signal for data transfer is constantly output, which eliminates the need to issue a CAS command for synchronization between the clock signal for data transfer and the clock signal for command transfer.

In a mode in which a clock signal for data transfer is output as appropriate, a CAS command is to be issued prior to a read or write command, and this can cause performance overhead. Further, if an access destination rank (Rank) is switched, a CAS command for a rank to be accessed subsequently is to be issued in consideration of a timing at which a previously-accessed rank becomes no longer synchronized, which can cause performance overhead.

Meanwhile, in a mode in which a clock signal for data transfer is output constantly, the clock signal for data transfer alternates between high and low levels even during a period without data transfer, which causes power consumption overhead.

SUMMARY

Various embodiments of the present disclosure are directed to reducing performance overhead and power consumption overhead.

According to one embodiment of the present disclosure, a memory control apparatus is provided that is configured to access a memory that involves synchronization of a clock signal for command transfer and a clock signal for data transfer with each other, the clock signal for command transfer and the clock signal for data transfer being independent of each other. The memory control apparatus includes an output unit configured to change an output mode of the clock signal for data transfer based on a memory access state and to output the clock signal for data transfer to the memory based on the output mode.

Further features of the present disclosure will become apparent from the following description of example embodiments with reference to the attached drawings.

DESCRIPTION OF THE EMBODIMENTS

Figure 1:
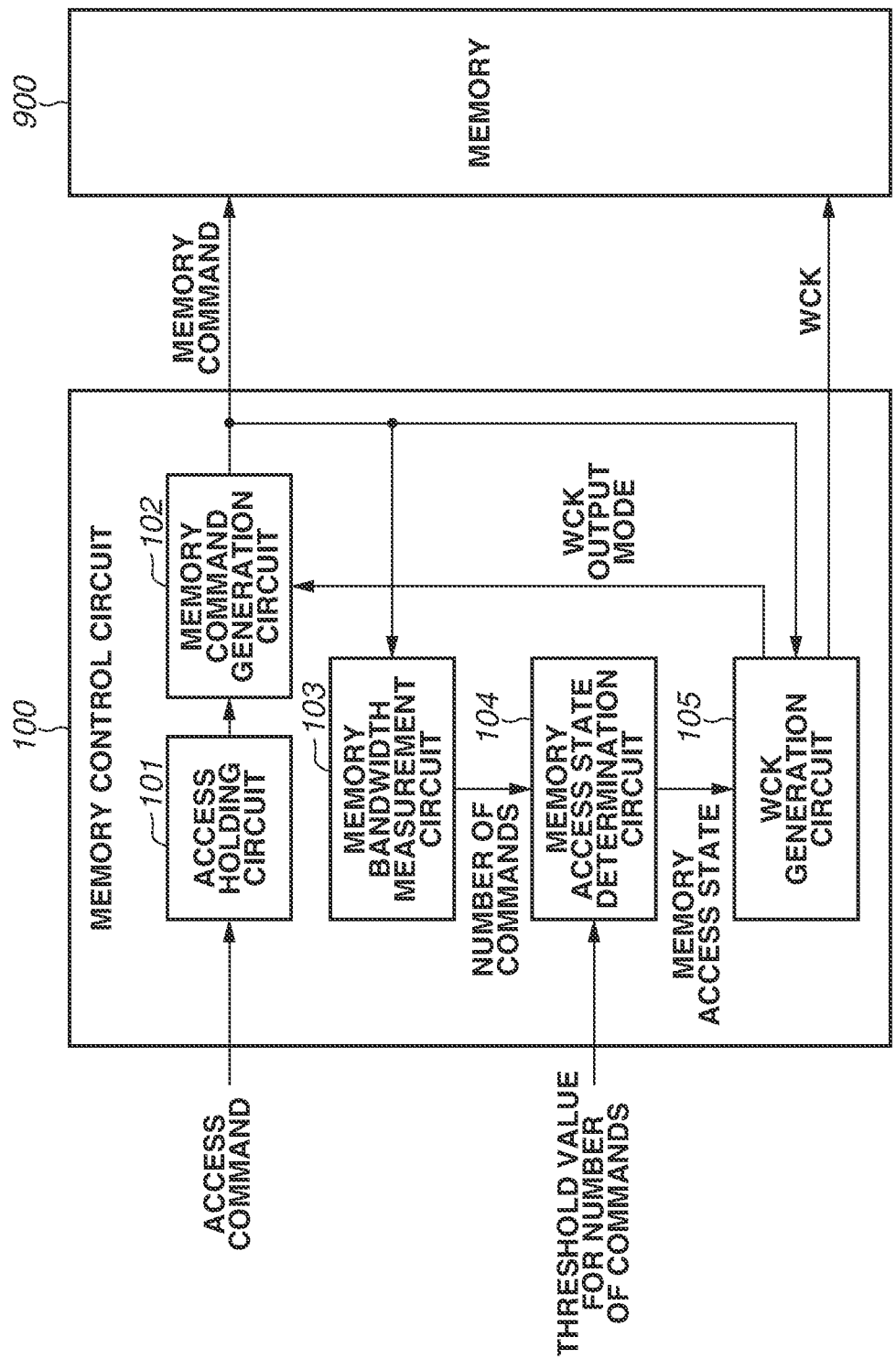
FIG. 1 illustrates an example of the configuration of a memory control circuit according to one embodiment.

FIG. 1 illustrates an example of the configuration of a memory control circuit 100 according to a first example embodiment. A memory 900 is connected to the memory control circuit 100. The memory control circuit 100 is a memory control apparatus and outputs a memory command and a clock signal WCK for data transfer to the memory 900.

The memory 900 is, for example, a Low Power Double Data Rate 5 synchronous dynamic random-access memory (LPDDR5 SDRAM). LPDDR5 is a SDRAM standard for reduced power consumption. In LPDDR5, a clock signal CK for command transfer and a clock signal WCK for data transfer are separated. The memory control circuit 100 issues a column address strobe (CAS) command for synchronizing the clock signal CK for command transfer with the clock signal WCK for data transfer and causes the clock signal WCK for data transfer to operate during the period alone in which data is to be transferred, reducing the power consumption. The memory 900 includes a plurality of ranks. Each of the plurality of ranks includes, for example, a plurality of SDRAM modules.

The memory control circuit 100 includes an access holding circuit 101, a memory command generation circuit 102, a memory bandwidth measurement circuit 103, a memory access state determination circuit 104, and a write clock (WCK) generation circuit 105. The WCK generation circuit 105 is a clock-signal-for-data-transfer generation circuit.

The access holding circuit 101 holds a plurality of access commands received from the outside. The memory command generation circuit 102 generates a memory command from an access command held by the access holding circuit 101 and issues the memory command to the memory 900.

The memory command is a read or write command. Further, the memory command generation circuit 102 determines whether to issue a CAS command before issuing a read or write command based on a clock-signal-for-data-transfer output mode (WCK output mode) from the WCK generation circuit 105. The CAS command is a synchronization command for synchronizing the clock signal WCK for data transfer and the clock signal CK for command transfer with each other.

The memory bandwidth measurement circuit 103 measures the number of read and write commands issued by the memory command generation circuit 102. Further, the memory bandwidth measurement circuit 103 resets the number of commands measured every predefined period. Thus, the memory bandwidth measurement circuit 103 measures the number of read and write commands every predefined period.

The memory access state determination circuit 104 determines whether a memory access state is a busy state based on the number of commands measured by the memory bandwidth measurement circuit 103 and a threshold value for the number of commands. If the number of commands measured by the memory bandwidth measurement circuit 103 is greater than or equal to the threshold value for the number of commands, the memory access state determination circuit 104 determines that the memory access state is a busy state. Further, if the number of commands measured by the memory bandwidth measurement circuit 103 is smaller than the threshold value for the number of commands, the memory access state determination circuit 104 determines that the memory access state is a non-busy state.

The WCK generation circuit 105 is a clock-signal-for-data-transfer generation circuit. If the memory access state determined by the memory access state determination circuit 104 is a busy state, the WCK generation circuit 105 changes the WCK output mode to a constantly-output mode and constantly outputs the clock signal WCK for data transfer to the memory 900. Further, if the memory access state determined by the memory access state determination circuit 104 is a non-busy state, the WCK generation circuit 105 changes the WCK output mode to an output-as-needed mode. In the output-as-needed mode, the WCK generation circuit 105 outputs the clock signal WCK for data transfer to the memory 900 based on a timing at which the memory command generation circuit 102 issues a read or write command.

Figure 2:
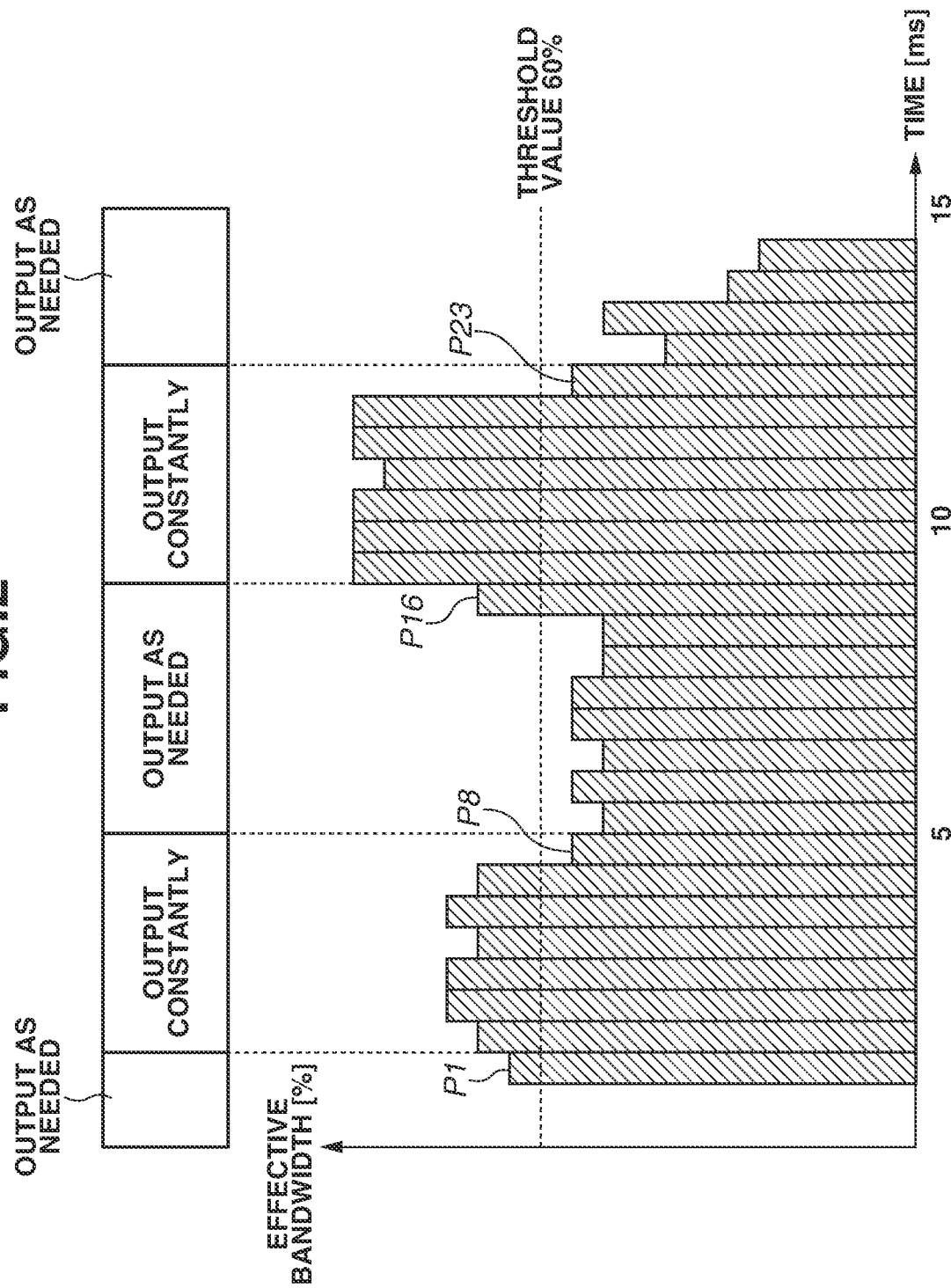
FIG. 2 is a transition diagram illustrating effective memory bandwidths and transitions between clock-signal-for-data-transfer output modes according to one embodiment.

FIG. 2 is a diagram chronologically illustrating effective bandwidths of the memory 900 and the WCK output modes according to the present example embodiment. The memory bandwidth measurement circuit 103 herein measures an effective bandwidth of the memory 900 every predefined period. The predefined period is, for example, 0.5 ms. Further, an initial value of the WCK output mode corresponds to the output-as-needed mode. Further, if the effective bandwidth of the memory 900 that is measured by the memory bandwidth measurement circuit 103 is greater than or equal to an effective bandwidth threshold value, the memory access state determination circuit 104 determines that the memory access state is a busy state. It is assumed that the effective bandwidth threshold value is 60%. A control method for the memory control circuit 100 will be described below.

Before and during a period P1, the WCK output mode is the output-as-needed mode. During the period P1, the effective bandwidth of the memory 900 is greater than the effective bandwidth threshold value, so that the memory access state determination circuit 104 determines that the memory access state is the busy state. Consequently, the WCK generation circuit 105 changes the WCK output mode to the constantly-output mode from the next period.

During a period P8, the effective bandwidth of the memory 900 is smaller than the effective bandwidth threshold value, so that the memory access state determination circuit 104 determines that the memory access state is the non-busy state. Consequently, the WCK generation circuit 105 changes the WCK output mode to the output-as-needed mode from the next period.

During a period P16, the effective bandwidth of the memory 900 is greater than the effective bandwidth threshold value, so that the memory access state determination circuit 104 determines that the memory access state is a busy state. Consequently, the WCK generation circuit 105 changes the WCK output mode to the constantly-output mode from the next period.

During a period P23, the effective bandwidth of the memory 900 is smaller than the effective bandwidth threshold value, so that the memory access state determination circuit 104 determines that the memory access state is a non-busy state. Consequently, the WCK generation circuit 105 changes the WCK output mode to the output-as-needed mode from the next period.

According to the present example embodiment, the effective bandwidth of the memory 900 is the number of read and write commands issued to the memory 900. If the clock signal CK for command transfer for the memory 900 has a frequency of 800 MHz, a 0.5-ms period corresponds to 400 cycles. If a single read or write command can be issued every two cycles at the fastest, a maximum of 200 read or write commands can be issued during a 0.5-ms period. Specifically, if 200 read or write commands are issued during a 0.5-ms period, the effective bandwidth of the memory 900 is 100%. If 120 or more read or write commands are issued during a 0.5-ms period, the effective bandwidth of the memory 900 is greater than or equal to the effective bandwidth threshold value as the effective bandwidth threshold value is 60%. Further, if less than 120 read or write commands are issued during a 0.5-ms period, the effective bandwidth of the memory 900 is smaller than the effective bandwidth threshold value. Thus, the threshold value for the number of commands is 120.

Figure 3:
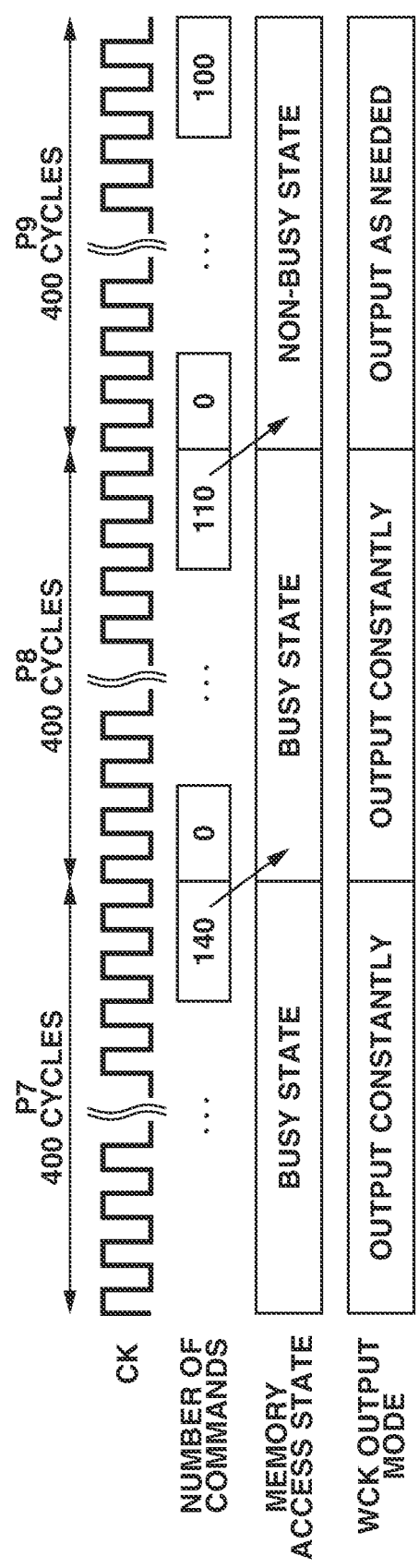
FIG. 3 illustrates an operation waveform of the memory control circuit according to one embodiment.

FIG. 3 illustrates the number of commands measured by the memory bandwidth measurement circuit 103, the memory access state determined by the memory access state determination circuit 104, and the WCK output mode set by the WCK generation circuit 105 in periods P7 to P9 as an example.

The number of commands measured by the memory bandwidth measurement circuit 103 during the period P7 is 140. Further, the number of commands measured by the memory bandwidth measurement circuit 103 during the period P8 is 110.

Further, the number of commands measured by the memory bandwidth measurement circuit 103 during the period P9 is 100.

The number of commands measured during the period P7, which is 140, is greater than the threshold value for the number of commands, which is 120, so that the memory access state determination circuit 104 sets the memory access state in the period P8 to the busy state. Further, the number of commands measured during the period P8, which is 110, is smaller than the threshold value for the number of commands, which is 120, so that the memory access state determination circuit 104 sets the memory access state in the period P9 to the non-busy state.

If the memory access state is the busy state, the WCK generation circuit 105 sets the WCK output mode to the constantly-output mode; if the memory access state is the non-busy state, the WCK generation circuit 105 sets the WCK output mode to the output-as-needed mode.

Figure 4:
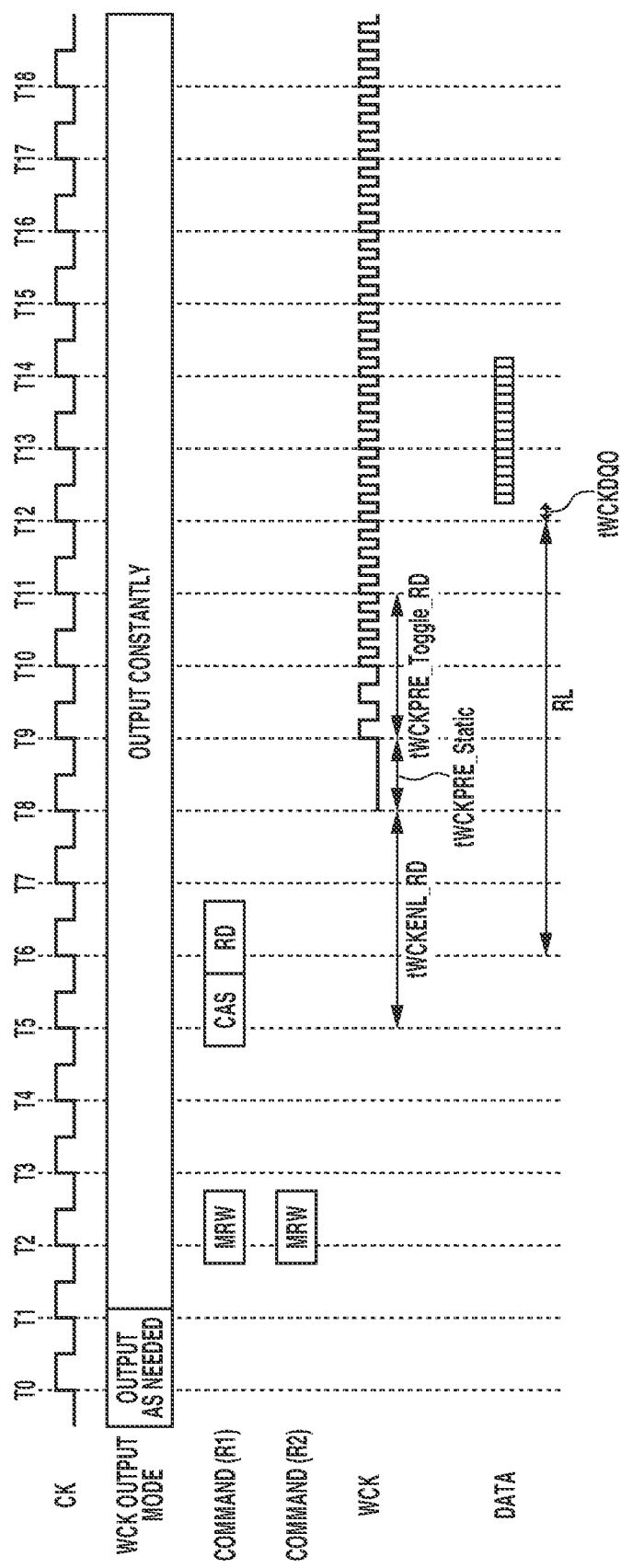
FIG. 4 illustrates operation waveforms in changing a clock-signal-for-data-transfer output mode according to one embodiment.

When the WCK output mode is changed from the output-as-needed mode to the constantly-output mode, the memory command generation circuit 102 issues a MRW command for changing a setting of the memory 900. This is illustrated in FIG. 4. The memory 900 includes ranks R1 and R2, for example. At a time T1, the WCK output mode is changed from the output-as-needed mode to the constantly-output mode. Thus, at a time T2, the memory command generation circuit 102 issues MRW commands to the ranks R1 and R2 of the memory 900.

Thereafter, at a time T5, the memory command generation circuit 102 issues a CAS command to the rank R1 of the memory 900 prior to a first time read command RD (or write command). The CAS command is a synchronization command for synchronizing the clock signal WCK for data transfer and the clock signal CK for command transfer with each other. At a time T6, the memory command generation circuit 102 issues the first time read command RD to the rank R1 of the memory 900. After a period tWCKENL_RD from the issuance of the CAS command at the time T5, the WCK generation circuit 105 starts outputting the clock signal WCK for data transfer to the memory 900. During a period tWCKPRE_Static, the WCK generation circuit 105 fixes the clock signal WCK for data transfer at a low level (or high level). Thereafter, during a period tWCKPRE_Toggle_RD, the WCK generation circuit 105 starts causing the clock signal WCK for data transfer to alternate between a high level and the low level.

Figure 5:
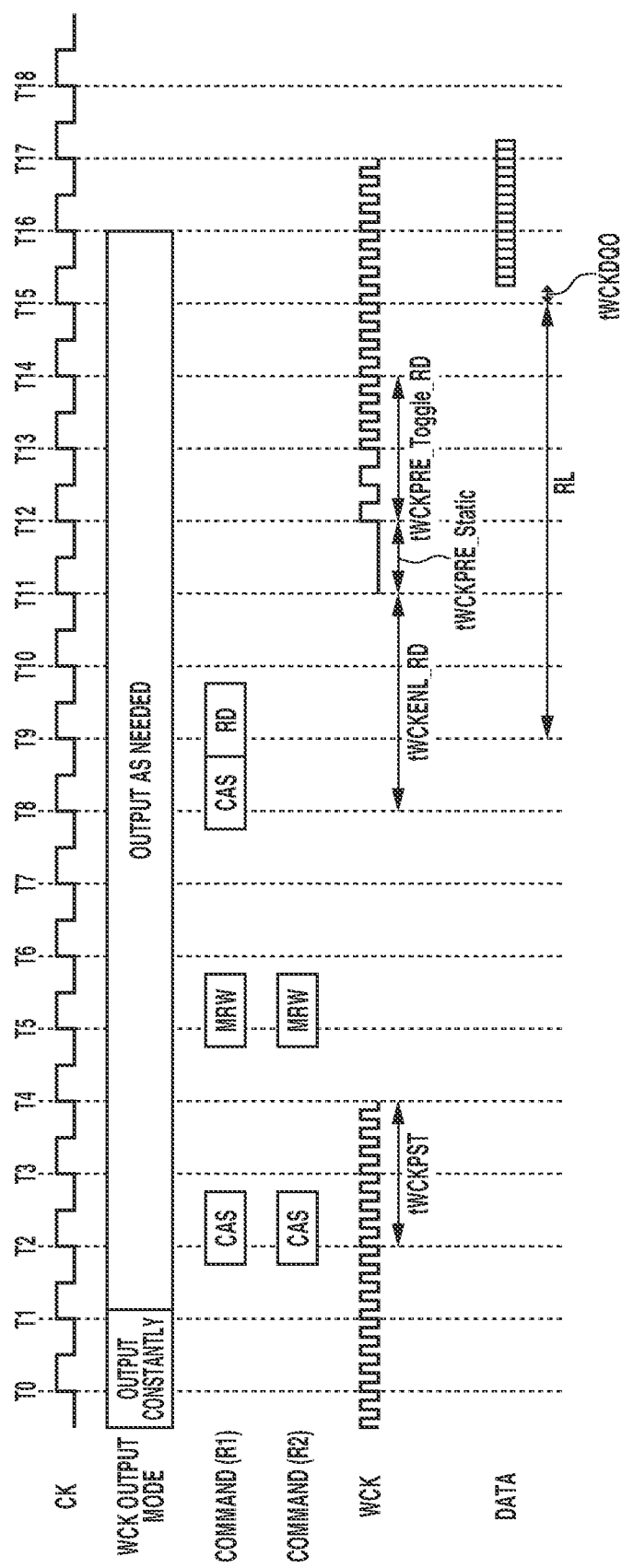
FIG. 5 illustrates operation waveforms in changing a clock-signal-for-data-transfer output mode according to one embodiment.

Further, if the WCK output mode is changed from the constantly-output mode to the output-as-needed mode, the memory command generation circuit 102 issues a CAS command for stopping outputting the clock signal WCK for data transfer. Then, after the outputting of the clock signal WCK for data transfer is stopped, the memory command generation circuit 102 issues a MRW command for changing a register setting of the memory 900. This is illustrated in FIG. 5. At a time T1, the WCK output mode is changed from the constantly-output mode to the output-as-needed mode. Thus, at a time T2, the memory command generation circuit 102 issues CAS commands for stopping outputting the clock signal WCK for data transfer to the ranks R1 and R2 of the memory 900. After a period tWCKPST, the outputting of the clock signal WCK for data transfer stops, so that at a time T5, the memory command generation circuit 102 issues MRW commands to the ranks R1 and R2 of the memory 900. Thereafter, at a time T8, the memory command generation circuit 102 issues a CAS command to the rank R1 of the memory 900 prior to a read command RD (or write command). The CAS command is a synchronization command for synchronizing the clock signal WCK for data transfer and the clock signal CK for command transfer with each other. At a time T9, the memory command generation circuit 102 issues a read command RD to the rank R1 of the memory 900. After the period tWCKENL_RD from the issuance of the CAS command at the time T8, the WCK generation circuit 105 starts outputting the clock signal WCK for data transfer to the memory 900. During the period tWCKPRE_Static, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels.

FIGS. 6 to 9 illustrate an example of waveforms when two read commands RD are issued to the rank R1 in each WCK output mode and when two read commands RD are issued to the different ranks R1 and R2 in each WCK output mode. It is assumed that each read command RD includes 16-beat data. To transfer 16-beat data, a period corresponding to two cycles for the clock signal CK for command transfer is used. Thus, the read commands RD are to be issued at an interval therebetween that corresponds to two or more cycles for the clock signal CK for command transfer. The read commands RD to the different ranks R1 and R2 are to be issued at an interval therebetween that corresponds to three or more cycles of the clock signal CK for command transfer to avoid a data collision.

Figure 6:
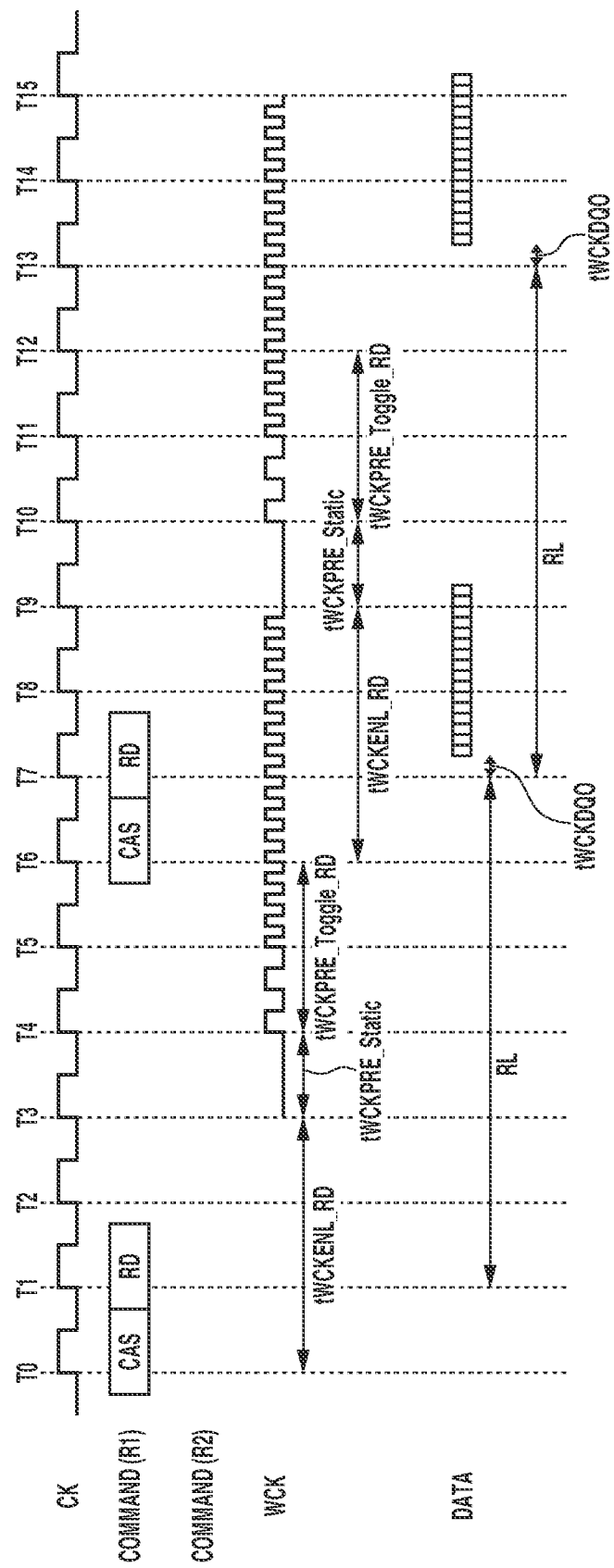
FIG. 6 illustrates waveforms of clock signals for command and data transfer and data according to one embodiment.

FIG. 6 illustrates waveforms in the output-as-needed mode as the WCK output mode and when a CAS command is to be issued while two read commands RD are issued to the rank R1 of the memory 900.

At a time T0, the memory command generation circuit 102 issues a CAS command for synchronizing the clock signal WCK for data transfer and the clock signal CK for command transfer with each other to the rank R1 of the memory 900. At a time T1, the memory command generation circuit 102 issues a read command RD to the rank R1 of the memory 900. After the period tWCKENL_RD from the issuance of the CAS command at the time T0, the WCK generation circuit 105 starts outputting the clock signal WCK for data transfer to the memory 900. During the period tWCKPRE_Static, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels. Thereafter, during the period tWCKENL_RD, the WCK generation circuit 105 continues causing the clock signal WCK for data transfer to alternate between the high and low levels.

At a time T6, if the memory command generation circuit 102 is to issue a read command RD to the rank R1 of the memory 900, the clock signal WCK for data transfer and the clock signal CK for command transfer are to be synchronized with each other. At the time T6, the memory command generation circuit 102 issues a CAS command to the rank R1 of the memory 900. At a time T7, the memory command generation circuit 102 issues a read command RD to the rank R1 of the memory 900. During the period tWCKPRE_Static after the period tWCKENL_RD from the issuance of the CAS command at the time T6, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels.

Figure 7:
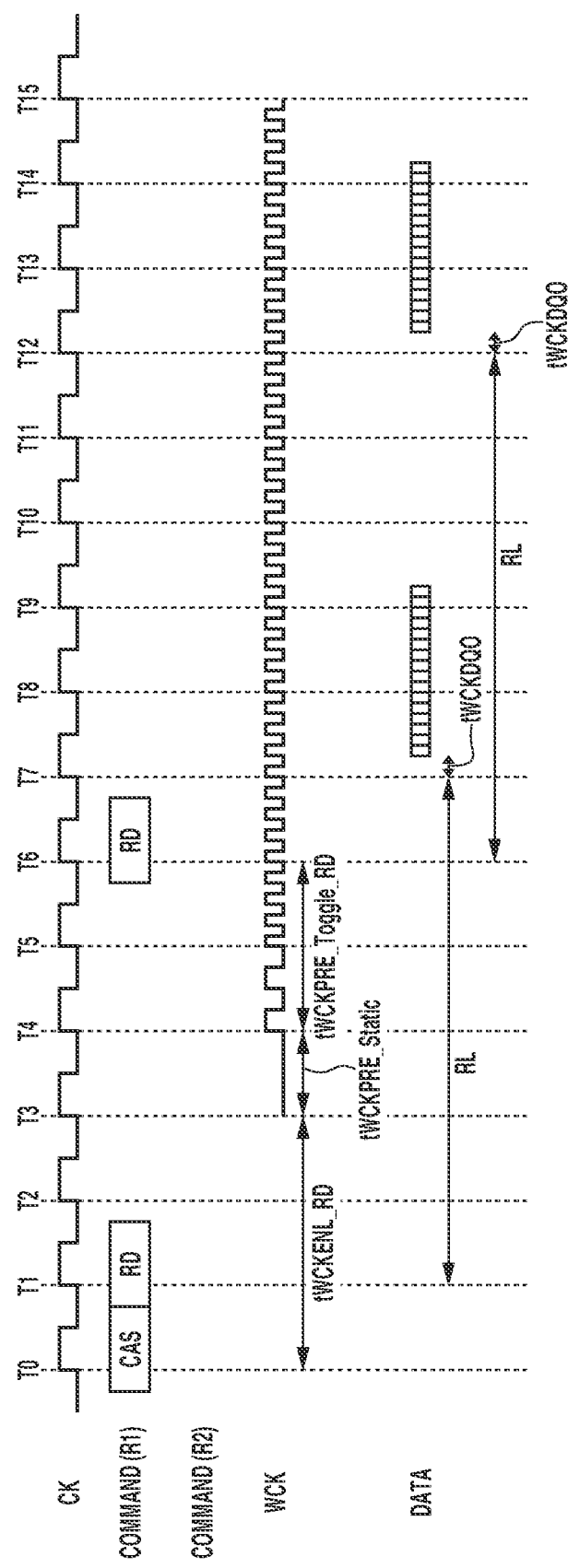
FIG. 7 illustrates waveforms of clock signals for command and data transfer and data according to one embodiment.

FIG. 7 illustrates waveforms in the constantly-output mode as the WCK output mode and when no CAS command is to be issued while two read commands RD are issued to the rank R1 of the memory 900.

At a time T0, the memory command generation circuit 102 issues a CAS command for synchronizing the clock signal WCK for data transfer and the clock signal CK for command transfer with each other to the rank R1 of the memory 900. At a time T1, the memory command generation circuit 102 issues a read command RD to the rank R1 of the memory 900. After the period tWCKENL_RD from the issuance of the CAS command at the time T0, the WCK generation circuit 105 starts outputting the clock signal WCK for data transfer to the memory 900. During the period tWCKPRE_Static, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels. Thereafter, the WCK generation circuit 105 continues causing the clock signal WCK for data transfer to alternate between the high and low levels.

At a time T6, if the memory command generation circuit 102 is to issue a read command RD to the rank R1 of the memory 900, the memory command generation circuit 102 can immediately issue the read command RD. At the time T6, the memory command generation circuit 102 does not issue a CAS command and issues a read command RD to the rank R1 of the memory 900. Thereafter, the WCK generation circuit 105 continues causing the clock signal WCK for data transfer to alternate between the high and low levels.

Figure 8:
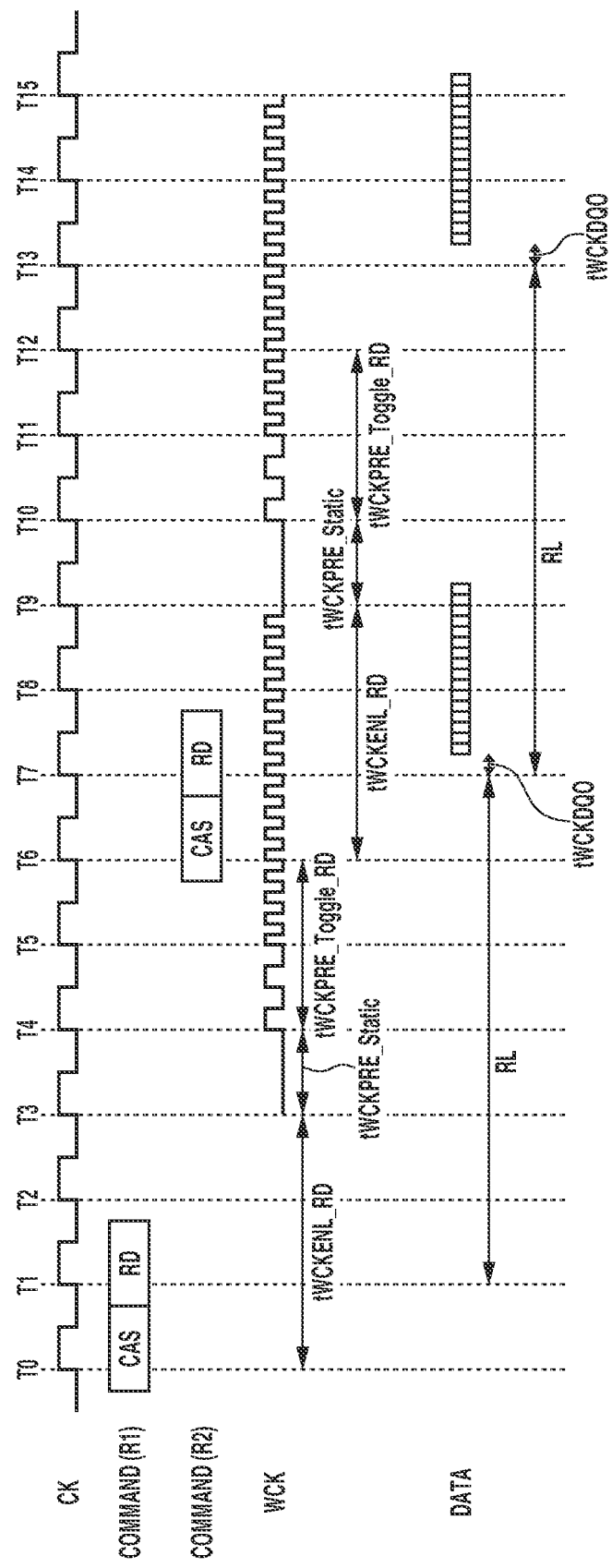
FIG. 8 illustrates waveforms of clock signals for command and data transfer and data according to one embodiment.

FIG. 8 illustrates waveforms in the output-as-needed mode as the WCK output mode and when a CAS command is to be issued while two read commands RD are issued to the different ranks R1 and R2 of the memory 900.

At a time T0, the memory command generation circuit 102 issues a CAS command for synchronizing the clock signal WCK for data transfer and the clock signal CK for command transfer with each other to the rank R1 of the memory 900. At a time T1, the memory command generation circuit 102 issues a read command RD to the rank R1 of the memory 900. After the period tWCKENL_RD from the issuance of the CAS command at the time T0, the WCK generation circuit 105 starts outputting the clock signal WCK for data transfer to the memory 900. During the period tWCKPRE_Static, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels. Thereafter, during the period tWCKENL_RD, the WCK generation circuit 105 continues causing the clock signal WCK for data transfer to alternate between the high and low levels.

If the memory command generation circuit 102 is to issue a read command RD to the rank R2 of the memory 900 at or after a time T2, the clock signal WCK for data transfer and the clock signal CK for command transfer are to be synchronized with each other. A timing of completing the alternation of the clock signal WCK for data transfer to the rank R1 of the memory 900 between the high and low levels and a timing of starting the outputting of the clock signal WCK for data transfer to the rank R2 of the memory 900 is not to be matched. Thus, at a time T6, the memory command generation circuit 102 issues a CAS command to the rank R2 of the memory 900. At a time T7, the memory command generation circuit 102 issues a read command RD to the rank R2 of the memory 900. During the period tWCKPRE_Static after the period tWCKENL_RD from the issuance of the CAS command at the time T6, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels.

Figure 9:
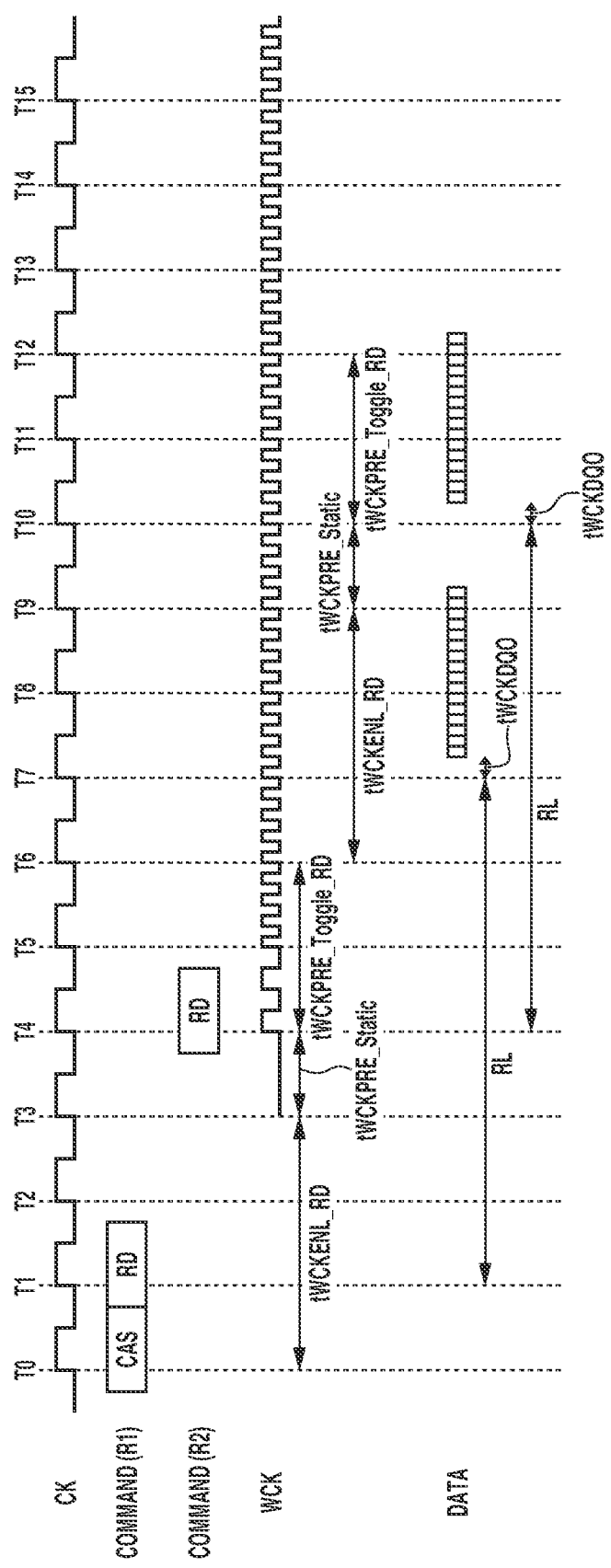
FIG. 9 illustrates waveforms of clock signals for command and data transfer and data according to one embodiment.

FIG. 9 illustrates waveforms in the constantly-output mode as the WCK output mode and when no CAS command is to be issued while two read commands RD are issued to the different ranks R1 and R2 of the memory 900.

At a time T0, the memory command generation circuit 102 issues a CAS command for synchronizing the clock signal WCK for data transfer and the clock signal CK for command transfer with each other to the rank R1 of the memory 900. At a time T1, the memory command generation circuit 102 issues a read command RD to the rank R1 of the memory 900. After the period tWCKENL_RD from the issuance of the CAS command at the time T0, the WCK generation circuit 105 starts outputting the clock signal WCK for data transfer to the memory 900. During the period tWCKPRE_Static, the WCK generation circuit 105 fixes the clock signal WCK for data transfer at the low level (or high level). Thereafter, during the period tWCKPRE_Toggle_RD, the WCK generation circuit 105 starts causing the clock signal WCK for data transfer to alternate between the high and low levels. Thereafter, the WCK generation circuit 105 continues causing the clock signal WCK for data transfer to alternate between the high and low levels.

If the memory command generation circuit 102 is to issue a read command RD to the rank R2 of the memory 900 at or after a time T2, the clock signal WCK for data transfer and the clock signal CK for command transfer is not to be synchronized with each other. Thus, at a time T4, the memory command generation circuit 102 does not issue a CAS command and issues a read command RD to the rank R2 of the memory 900. Thereafter, the WCK generation circuit 105 continues causing the clock signal WCK for data transfer to alternate between the high and low levels.

As described above, in the constantly-output mode as the WCK output mode in FIGS. 7 and 9, the memory command generation circuit 102 does not have to issue a CAS command before the second time read command RD. This is advantageous in performance. In the constantly-output mode, the WCK generation circuit 105 continues causing the clock signal WCK for data transfer to alternate between the high and low levels, which increases the power consumption as a disadvantage.

According to the present example embodiment, if the effective bandwidth of the memory 900 is greater than or equal to the effective bandwidth threshold value, the WCK generation circuit 105 sets the WCK output mode to the constantly-output mode, reducing the performance overhead. Further, if the effective bandwidth of the memory 900 is smaller than the effective bandwidth threshold value, the WCK generation circuit 105 sets the WCK output mode to the output-as-needed mode, reducing the power consumption overhead.

While a method in which the memory bandwidth measurement circuit 103 measures the number of commands issued has been described above as an example of a method of measuring an effective bandwidth of the memory 900 by the memory bandwidth measurement circuit 103, the present example embodiment is not limited to the above-described example. Any methods of measuring an effective bandwidth of the memory 900 or another similar measurement target can be used.

As described above, the memory control circuit 100 accesses the memory 900 that involves the synchronization of the clock signal CK for command transfer and the clock signal WCK for data transfer with each other as the clock signal CK for command transfer and the clock signal WCK for data transfer are independent of each other.

The WCK generation circuit 105 as an output unit changes the WCK output mode of the clock signal WCK for data transfer based on the memory access state, and outputs the clock signal WCK for data transfer to the memory 900 based on the WCK output mode.

Specifically, in the busy state as the memory access state, the WCK generation circuit 105 sets the WCK output mode to the "constantly-output" mode. In the "constantly-output" mode, the WCK generation circuit 105 constantly outputs the clock signal WCK for data transfer to the memory 900.

Further, in the non-busy state as the memory access state, the WCK generation circuit 105 sets the WCK output mode to the "output as needed" mode. In the "output as needed" mode, the WCK generation circuit 105 outputs the clock signal WCK for data transfer to the memory 900 as needed.

With the effective bandwidth of the memory 900 during a predefined period being greater than or equal to the effective bandwidth threshold value, the memory access state determination circuit 104 determines that the memory access state is the busy state. Further, with the effective bandwidth of the memory 900 during a predefined period being smaller than the effective bandwidth threshold value, the memory access state determination circuit 104 determines that the memory access state is the non-busy state.

The memory command generation circuit 102 as an issuing unit can issue read, write, and CAS commands to the memory 900. A CAS command is a synchronization command for synchronizing the clock signal CK for command transfer and the clock signal WCK for data transfer with each other.

The memory bandwidth measurement circuit 103 measures the total number of read and write commands issued by the memory command generation circuit 102 during a predefined period. If the total number of read and write commands issued by the memory command generation circuit 102 during a predefined period is greater than or equal to the threshold value for the number of commands, the memory access state determination circuit 104 determines that the memory access state is the busy state. Further, if the total number of read and write commands issued by the memory command generation circuit 102 during a predefined period is smaller than the threshold value for the number of commands, the memory access state determination circuit 104 determines that the memory access state is the non-busy state.

FIGS. 6 and 8 illustrate the cases where the WCK output mode is the "output as needed" mode. In FIGS. 6 and 8, the memory command generation circuit 102 issues a CAS command between the issuance of a previous read or write command and the issuance of a current read or write command.

In FIG. 6, at the time T1, the memory command generation circuit 102 issues the previous read or write command to the rank R1 of the memory 900. At the time T7, the memory command generation circuit 102 issues the current read or write command to the rank R1 of the memory 900. At the time T6, the memory command generation circuit 102 issues the CAS command to the rank R1 of the memory 900.

In FIG. 8, at the time T1, the memory command generation circuit 102 issues the previous read or write command to the rank R1 of the memory 900. At the time T7, the memory command generation circuit 102 issues the current read or write command to the rank R2 of the memory 900. The rank R2 is a rank different from the rank R1. At the time T6, the memory command generation circuit 102 issues the CAS command to the rank R2 of the memory 900.

FIGS. 7 and 9 illustrate the cases where the WCK output mode is the "constantly-output" mode. In FIGS. 7 and 9, the memory command generation circuit 102 issues no CAS command between the issuance of the previous read or write command and the issuance of the current read or write command.

As described above, according to the present example embodiment, when memory access is made frequently, the memory control circuit 100 sets the clock signal WCK for data transfer to the constantly-output mode, reducing the performance overhead. Further, when memory access is not made frequently, the memory control circuit 100 sets the clock signal WCK for data transfer to the output-as-needed mode, reducing the power consumption overhead.

Figure 10:
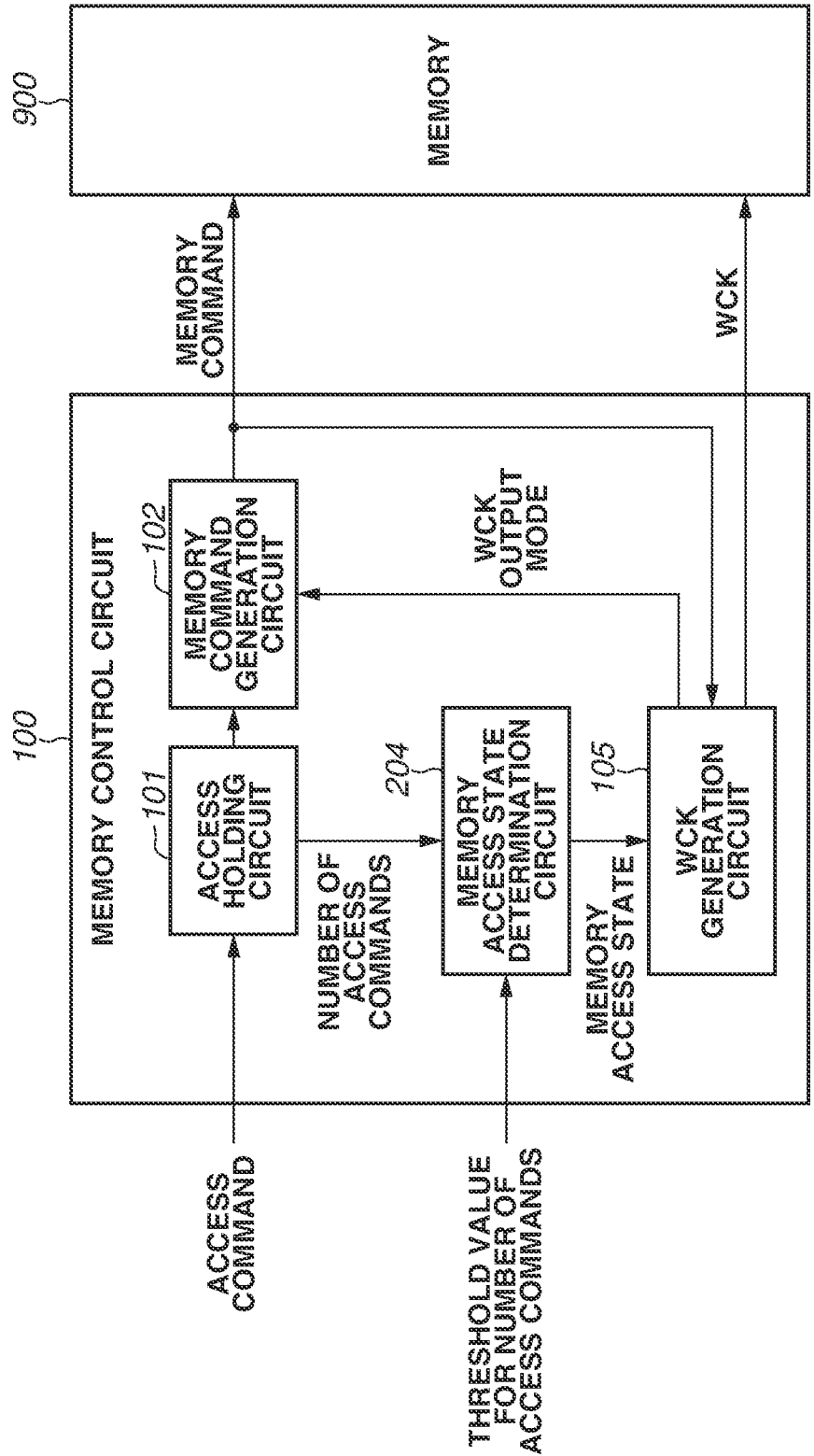
FIG. 10 illustrates an example of the configuration of a memory control circuit according to one embodiment.

FIG. 10 illustrates an example of the configuration of a memory control circuit 100 according to a second example embodiment. The memory control circuit 100 in FIG. 10 corresponds to the memory control circuit 100 in FIG. 1 that excludes the memory bandwidth measurement circuit 103 and the memory access state determination circuit 104 and includes the memory access state determination circuit 204. Differences between the second example embodiment and the first example embodiment will be described below. The access holding circuit 101, the memory command generation circuit 102, and the WCK generation circuit 105 in FIG. 10 are similar to those in FIG. 1, so that redundant descriptions thereof will be omitted. The memory access state determination circuit 204 determines whether the memory access state is the busy state based on the number of access commands held by the access holding circuit 101 and a threshold value for the number of access commands and outputs the memory access state to the WCK generation circuit 105. If the number of access commands held by the access holding circuit 101 is greater than or equal to the threshold value for the number of access commands, the memory access state determination circuit 204 determines that the memory access state is the busy state. Further, if the number of access commands held by the access holding circuit 101 is smaller than the threshold value for the number of access commands, the memory access state determination circuit 204 determines that the memory access state is the non-busy state.

Figure 11:
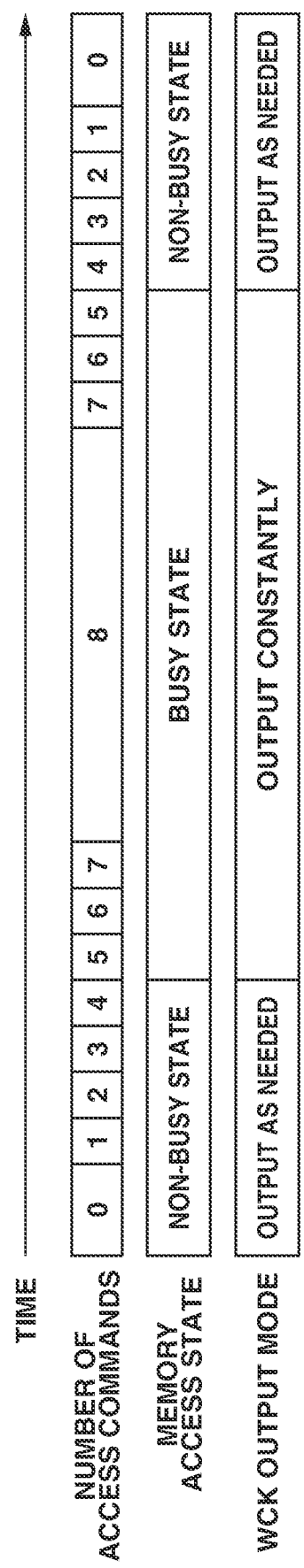
FIG. 11 is a transition diagram illustrating transitions between clock-signal-for-data-transfer output modes according to one embodiment.

FIG. 11 illustrates the number of access commands held by the access holding circuit 101, the memory access state determined by the memory access state determination circuit 204, and the WCK output mode set by the WCK generation circuit 105. A case where the threshold value for the number of access commands is five will be described below.

The access holding circuit 101 holds access commands received from the outside. The number of access commands held by the access holding circuit 101 increases with time. If the number of access commands held by the access holding circuit 101 is smaller than the threshold value for the number of access commands (e.g., 5), the memory access state determination circuit 204 determines that the memory access state is the non-busy state. With the non-busy state as the memory access state, the WCK generation circuit 105 sets the WCK output mode to the output-as-needed mode.

If the number of access commands held by the access holding circuit 101 is greater than or equal to the threshold value for the number of access commands (e.g., 5), the memory access state determination circuit 204 determines that the memory access state is the busy state. With the busy state as the memory access state, the WCK generation circuit 105 sets the WCK output mode to the constantly-output mode.

The memory command generation circuit 102 generates a memory command based on an access command held by the access holding circuit 101. As a result, the number of access commands held by the access holding circuit 101 decreases. The number of access commands decreases with time.

If the number of access commands held by the access holding circuit 101 is smaller than the threshold value for the number of access commands (e.g., 5), the memory access state determination circuit 204 determines that the memory access state is the non-busy state. With the non-busy state as the memory access state, the WCK generation circuit 105 sets the WCK output mode to the output-as-needed mode.

According to the present example embodiment, with the number of access commands held by the access holding circuit 101 being greater than or equal to the threshold value for the number of access commands, the WCK generation circuit 105 sets the WCK output mode to the constantly-output mode, reducing the performance overhead. Further, with the number of access commands held by the access holding circuit 101 being smaller than the threshold value for the number of access commands, the WCK generation circuit 105 sets the WCK output mode to the output-as-needed mode, reducing the power consumption overhead.

As described above, the clock signal CK for command transfer and the clock signal WCK for data transfer are independent of each other, which involves the synchronization of the clock signal CK for command transfer and the clock signal WCK for data transfer with each other. The memory control circuit 100 can access the memory 900 with such a specification.

The access holding circuit 101 as a holding unit holds access commands received from the outside. The memory command generation circuit 102 issues a read or write command to the memory 900 based on an access command held by the access holding circuit 101.

If the number of access commands held by the access holding circuit 101 is greater than or equal to the threshold value for the number of access commands, the memory access state determination circuit 204 determines that the memory access state is the busy state. Further, if the number of access commands held by the access holding circuit 101 is smaller than the threshold value for the number of access commands, the memory access state determination circuit 204 determines that the memory access state is the non-busy state.

As described above, according to the present example embodiment, if memory access is made frequently, the memory control circuit 100 sets the clock signal WCK for data transfer to the constantly-output mode, reducing the performance overhead. Further, if memory access is not made frequently, the memory control circuit 100 sets the clock signal WCK for data transfer to the output-as-needed mode, reducing the power consumption overhead.

Other Embodiments

Various embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc™ (BD)), a flash memory device, a memory card, and the like.

While example embodiments have been described, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2022-026623, filed Feb. 24, 2022, which is hereby incorporated by reference herein in its entirety.

What is claimed is:

1. A memory control apparatus configured to access a memory that involves synchronization of a clock signal for command transfer and a clock signal for data transfer with each other, the clock signal for command transfer and the clock signal for data transfer being independent of each other, and the memory control apparatus comprising:
    an output unit configured to change an output mode of the clock signal for data transfer based on a memory access state and to output the clock signal for data transfer to the memory based on the output mode,
    wherein in a busy state as the memory access state, the output unit sets a first output mode, and constantly outputs the clock signal for data transfer to the memory in the first output mode, and
    wherein in a non-busy state as the memory access state, the output unit sets a second output mode, and outputs the clock signal for data transfer to the memory as needed in the second output mode.

2. The memory control apparatus according to claim 1, wherein with an effective bandwidth of the memory during a predefined period being greater than or equal to a first threshold value, the memory access state is the busy state, and with the effective bandwidth of the memory during a predefined period being smaller than the first threshold value, the memory access state is the non-busy state.

3. The memory control apparatus according to claim 1, further comprising an issuing unit configured to issue a read or write command to the memory.

4. The memory control apparatus according to claim 3, wherein with a total number of read and write commands issued by the issuing unit during a predefined period being greater than or equal to a second threshold value, the memory access state is the busy state, and with the total number of the read and write commands issued by the issuing unit during a predefined period being smaller than the second threshold value, the memory access state is the non-busy state.

5. The memory control apparatus according to claim 3, wherein the issuing unit issues a synchronization command for synchronizing the clock signal for command transfer and the clock signal for data transfer with each other to the memory.

6. The memory control apparatus according to claim 5,
wherein in the busy state as the memory access state, the output unit sets the first output mode, and constantly outputs the clock signal for data transfer to the memory in the first output mode, and wherein in the non-busy state as the memory access state, the output unit sets the second output mode, and outputs the clock signal for data transfer to the memory as needed in the second output mode, wherein in the first output mode, the issuing unit does not issue the synchronization command for synchronizing the clock signal for command transfer and the clock signal for data transfer with each other between issuance of a previous read or write command and issuance of a current read or write command, and wherein in the second output mode, the issuing unit issues the synchronization command for synchronizing the clock signal for command transfer and the clock signal for data transfer with each other between the issuance of the previous read or write command and the issuance of the current read or write command.

7. The memory control apparatus according to claim 6, wherein in the second output mode, the issuing unit issues the previous read or write command to a first rank of the memory, issues the current read or write command to the first rank of the memory, and issues the synchronization command to the first rank of the memory.

8. The memory control apparatus according to claim 6, wherein in the second output mode, the issuing unit issues the previous read or write command to a first rank of the memory, issues the current read or write command to a second rank of the memory, and issues the synchronization command to the second rank of the memory, the second rank being different from the first rank.

9. The memory control apparatus according to claim 1, further comprising a holding unit configured to hold a received access command.

10. The memory control apparatus according to claim 9, further comprising an issuing unit configured to issue a read or write command to the memory based on the access command held by the holding unit.

11. The memory control apparatus according to claim 9, wherein with a number of access commands held by the holding unit being greater than or equal to a third threshold value, the memory access state is the busy state, and with the number of access commands held by the holding unit being smaller than the third threshold value, the memory access state is the non-busy state.

12. A method for controlling a memory control apparatus configured to access a memory that involves synchronization of a clock signal for command transfer and a clock signal for data transfer with each other, the clock signal for command transfer and the clock signal for data transfer being independent of each other, the method comprising:

changing an output mode of the clock signal for data transfer based on a memory access state and outputting the clock signal for data transfer to the memory based on the output mode, wherein in a busy state as the memory access state, the changing sets a first output mode, and the outputting constantly outputs the clock signal for data transfer to the memory in the first output mode, and wherein in a non-busy state as the memory access state, the changing sets a second output mode, and the outputting outputs the clock signal for data transfer to the memory as needed in the second output mode.

13. A non-transitory storage medium storing a program causing a memory control apparatus configured to access a memory that involves synchronization of a clock signal for command transfer and a clock signal for data transfer with each other, the clock signal for command transfer and the clock signal for data transfer being independent of each other, to execute a control method, the control method comprising:

changing an output mode of the clock signal for data transfer based on a memory access state and outputting the clock signal for data transfer to the memory based on the output mode, wherein in a busy state as the memory access state, the changing sets a first output mode, and the outputting constantly outputs the clock signal for data transfer to the memory in the first output mode, and wherein in a non-busy state as the memory access state, the changing sets a second output mode, and the outputting outputs the clock signal for data transfer to the memory as needed in the second output mode.

* * * * *